United States Patent [19]
Chang

[11] Patent Number: 5,869,380
[45] Date of Patent: Feb. 9, 1999

[54] METHOD FOR FORMING A BIPOLAR JUNCTION TRANSISTOR

[75] Inventor: Kuan-Lun Chang, Hsinchu, Taiwan

[73] Assignee: Industrial Technology Research Institute, Hsin-Chu, Taiwan

[21] Appl. No.: 110,424

[22] Filed: Jul. 6, 1998

[51] Int. Cl.⁶ .................................................. H01L 21/331
[52] U.S. Cl. .................... 438/309; 438/365; 438/350
[58] Field of Search .................... 438/309, 364, 438/370, 350, 365; 257/592

[56] References Cited

U.S. PATENT DOCUMENTS

| | | | |
|---|---|---|---|
| 4,412,378 | 11/1983 | Shinada | 438/370 |
| 4,717,677 | 1/1988 | McLaughlin et al. | 438/370 |
| 5,006,476 | 4/1991 | De Jong et al. | 438/370 |
| 5,064,774 | 11/1991 | Pfiester | 427/31 |
| 5,134,454 | 7/1992 | Neudeck et al. | 357/34 |
| 5,592,017 | 1/1997 | Johnson | 257/554 |
| 5,593,905 | 1/1997 | Johnson et al. | 437/31 |
| 5,631,495 | 5/1997 | Dunn et al. | 257/587 |
| 5,698,459 | 12/1997 | Grubisich et al. | 438/350 |
| 5,747,374 | 5/1998 | Jeon | 438/309 |
| 5,804,486 | 9/1998 | Zambrano et al. | 438/309 |

*Primary Examiner*—Tuan H. Nguyen
*Attorney, Agent, or Firm*—George O. Saile; Stephen B. Ackerman; Larry J. Prescott

[57] ABSTRACT

A bipolar junction transistor structure and method of forming the bipolar junction transistor structure comprising an intrinsic base surrounded by a base link and an extrinsic base surrounding the base link. An emitter is formed above the base. The extrinsic base, base link, and intrinsic base are formed using ion implantation. A single layer of doped polysilicon is used to provide the doping source for the emitter and a collector contact. Silicide contacts to the emitter, collector, or base are not required or used.

16 Claims, 5 Drawing Sheets

METHOD FOR FORMING A BIPOLAR JUNCTION TRANSISTOR

BACKGROUND OF THE INVENTION

1. Field of the Invention

This invention deals with a structure and method of forming the structure of a bipolar junction transistor having an extrinsic base, a base link, and an intrinsic base all formed by ion implantation and an emitter and a collector contact formed by diffusion of impurities from a single layer of doped polysilicon.

2. Description of the Related Art

U.S. Pat. No. 5,592,017 to Johnson describes a bipolar junction transistor structure and a method of forming the structure. A doped conductive spacer is formed adjacent to the base electrode and provides a doping source for forming a base link. An intrinsic base region, emitter region, and emitter electrode are then formed.

U.S. Pat. No. 5,593,905 to Johnson et al. describes a bipolar junction transistor structure and a method of forming the structure. A base link is diffused from a base link diffusion source layer. An extrinsic base region is diffused from a doped polysilicon base electrode.

U.S. Pat. No. 5,064,774 to Pfiester describes a method of forming a self aligned bipolar transistor using sidewall spacers on an opening in a patterned masking layer. The extrinsic and intrinsic base regions are formed by doping. Metal silicide contacts are formed to the extrinsic base and emitter electrode.

U.S. Pat. No. 5,134,454 to Neudeck et al. describes a method of forming a bipolar transistor which self aligns the base to the collector and the emitter to the base.

U.S. Pat. No. 5,631,495 to Dunn et al. describes high-performance bipolar transistors with improved wiring options. The transistor includes a base contact structure that has multiple contact pads, which permits multiple device layouts.

SUMMARY OF THE INVENTION

Bipolar junction transistors, BJT, find frequent use in integrated circuit applications and can be integrated into the same substrate in which metal oxide semiconductor, MOS, or complimentary metal oxide semiconductor, CMOS, field effect transistors are formed. The BJT devices usually have an extrinsic base and an intrinsic base with a base link connecting the extrinsic base and intrinsic base. A double polysilicon method with the formation of a silicide layer to reduce contact resistance is often used to provide emitter and base contacts and base connections.

It is a principle objective of this invention to provide a method of forming a bipolar junction transistor using a self aligned single polysilicon process which does not require or use silicide contacts for electrical connection to the emitter or collector regions and which uses ion implantation to form the extrinsic base, intrinsic base, and base link between the extrinsic and intrinsic base regions.

It is another principle objective of this invention to provide a bipolar junction transistor which has an extrinsic base, an intrinsic base, a base link, and which does not require or use silicide contacts for electrical connection to the emitter or collector regions.

These objectives are achieved by forming first dielectric patterns with second dielectric sidewalls on a doped silicon substrate. A first ion implantation is then used to form an extrinsic base region. The second dielectric spacers are then removed and a second ion implantation is used to form a base link. The first dielectric patterns are then removed and a third ion implantation is used to form an intrinsic base region.

Electrode patterns formed of doped polysilicon are then formed over the intrinsic base and a collector contact region. The doped polysilicon is doped with impurities such as phosphorus or arsenic. The transistor structure is formed in an N⁻ type epitaxial layer or an N⁻ well which is heated along with the doped polysilicon electrode patterns and the impurities from the doped polysilicon diffuse into the intrinsic base to form the emitter and into the collector contact region to form a low resistance electrical contact. The transistor structure can also be formed in a P⁻ type epitaxial layer or a P⁻ well.

DESCRIPTION OF THE PREFERRED EMBODIMENTS

Figure 1:
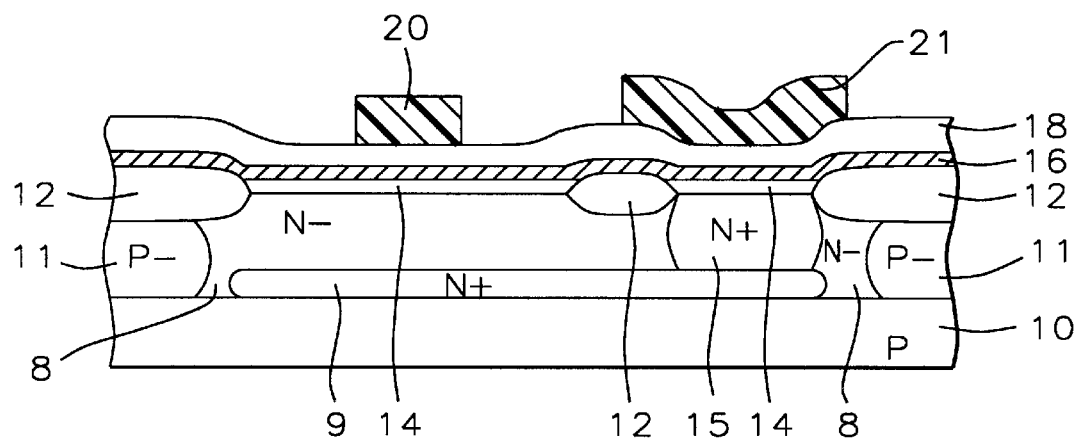
FIG. 1 shows a cross section view of an N⁻ type epitaxial layer formed on a P type substrate, or an N⁻ type well formed in the P type substrate; P⁻ wells formed in the N⁻ type epitaxial layer, or P type substrate; an N⁺ type buried layer in the N⁻ type epitaxial layer, or N⁻ type well; and an N⁺ collector formed in the N⁻ type epitaxial layer, or N⁻ type well. Field oxide isolation regions, a layer of pad oxide, a layer of undoped polysilicon, a layer of silicon nitride, and patterned photoresist are formed on thereon.

Refer now to FIGS. 1–13 for a description of the preferred embodiments of the bipolar junction transistor and the method of forming the bipolar junction transistor of this invention. FIG. 1 shows a cross section view of a P type silicon substrate 10 having an N⁻ type epitaxial layer 8 formed thereon. An N⁺ type buried layer 9 and an N⁺ type collector 15 are formed in the N⁻ type epitaxial layer 8. P⁻ type wells 11 are formed in the N⁻ type epitaxial layer 8 to provide isolation between devices. In place of the N⁻ type epitaxial layer N⁻ type wells can be formed in the P type substrate 10. In this case the N⁺ type buried layer 9 and an N⁺ type collector 15 are formed in the N⁻ type well. Field oxide regions 12 are formed as shown in FIG. 1 using a process such as local oxidation of silicon, LOCOS. A pad oxide layer 14, in this example silicon oxide having a thickness of between about 50 and 240 Angstroms, is formed on the structure.

This example will be an npn bipolar junction transistor but those skilled in the art will readily recognize that the method described can also be used to form a pnp bipolar junction transistor. In this case an N type silicon substrate 10 having a P⁻ type epitaxial layer 8 formed thereon is used. A P⁺ type buried layer 9 and an P⁺ type collector 15 are formed in the P⁻ type epitaxial layer 8. N⁻ type wells 11 are formed in the P⁻ type epitaxial layer 8 to provide isolation between devices. As in the case of the npn bipolar junction transistor, in place of the P⁻ type epitaxial layer P⁻ type wells can be formed in the N type substrate 10. In this case the P⁺ type buried layer 9 and an P⁺ type collector 15 are formed in the P⁻ type well.

Next, a thin layer of undoped first polysilicon 16 having a thickness of between about 100 and 250 Angstroms is formed on the structure. This thin layer of undoped polysilicon will eventually be oxidized or removed and is not counted in the self aligned single layer polysilicon process. A layer of first dielectric 18 is then formed on the thin layer of polysilicon 16. In this example the layer of first dielectric 18 is silicon nitride, $Si_3N_4$, having a thickness of between about 1600 and 2400 Angstroms and deposited using low pressure chemical vapor deposition. A patterned layer of photoresist is then formed on the layer of first dielectric 18 forming a first photoresist pattern 20 and a second photoresist pattern 21.

Figure 2:
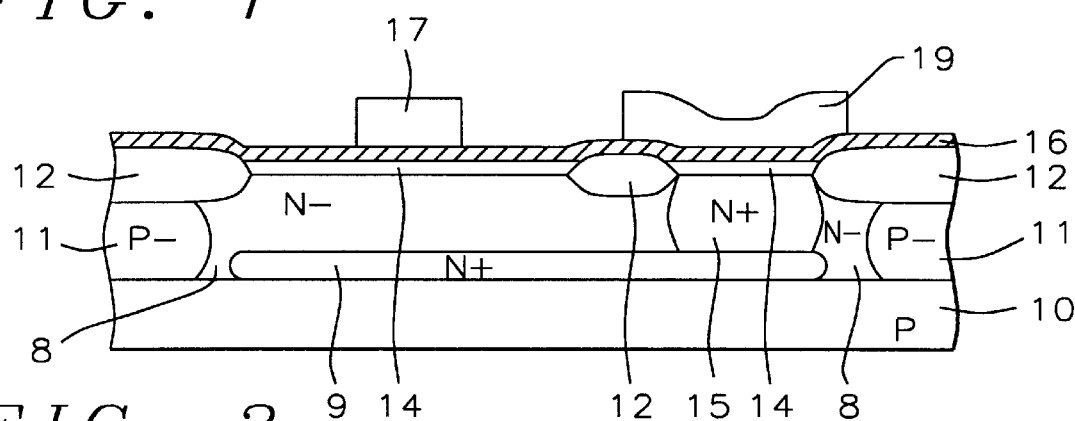
FIG. 2 shows a cross section view of the structure of FIG. 1 after patterning the layer of silicon nitride.
Figure 3:
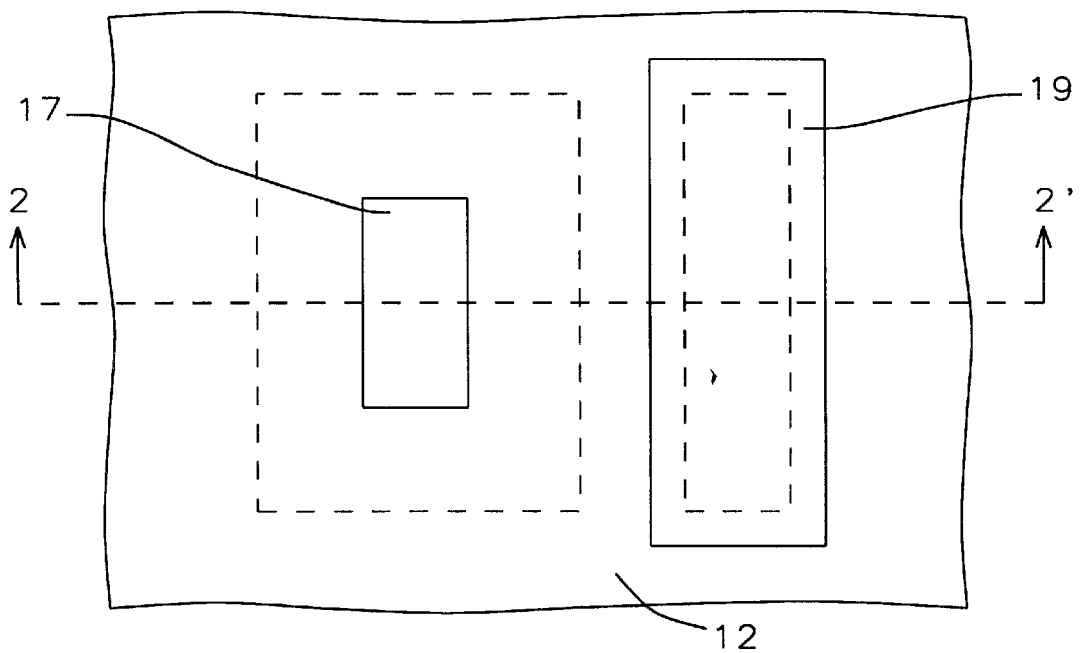
FIG. 3 shows a top view of the structure of FIG. 2.

Next, as shown in FIG. 2, the layer of first dielectric is patterned using dry anisotropic etching thereby forming a first dielectric first pattern 17 and a first dielectric second pattern 19 and the photoresist is removed. Both the first dielectric first pattern 17 and the first dielectric second pattern 19 have sidewalls. FIG. 3 shows a top view of this portion of the substrate at this stage of the processing showing the location of the first dielectric first pattern 17 and the first dielectric second pattern 19. The dotted lines in FIG. 3 shows the perimeter of the field oxide isolation region 12. This portion of the substrate has a first device region, a second device region, a third device region, and a collector contact region. The first device region is that part of the substrate directly below the first dielectric first pattern 17. The collector contact region is directly below the first dielectric second pattern 19 and the location of its perimeter will be described later. The location of the second device region and the third device region will also be described later.

Figure 4:
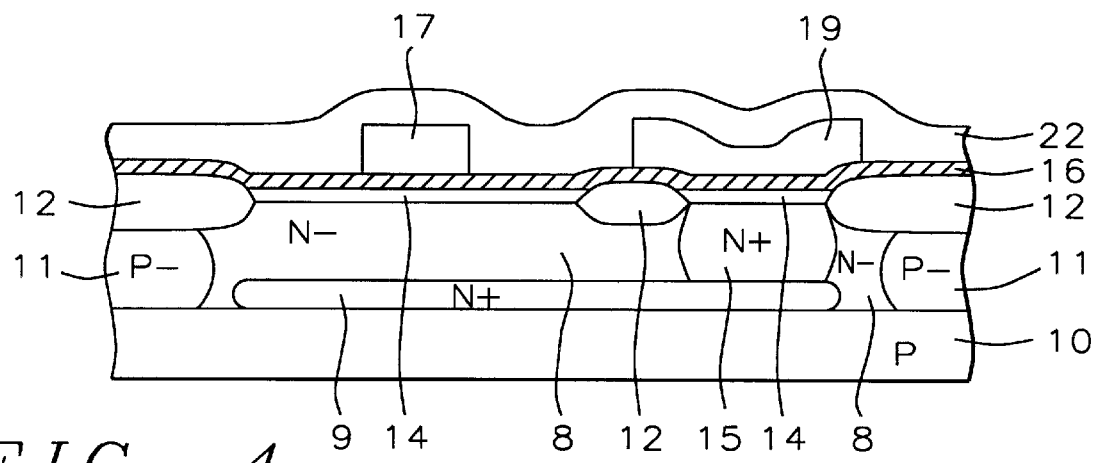
FIG. 4 shows a cross section view of the structure of FIG. 2 with a layer of dielectric which will be used to form dielectric spacers formed thereon.
Figure 5:
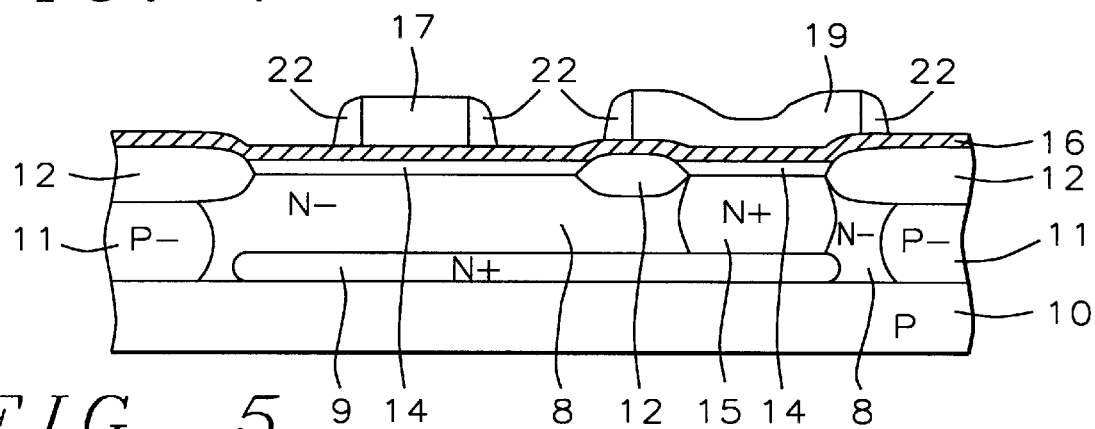
FIG. 5 shows a cross section view of the structure of FIG. 4 with the layer of dielectric back etched to form dielectric spacers.

As shown in FIG. 4, a layer of second dielectric 22, such as silicon oxide having a thickness of between about 2500 and 4000 Angstroms is then formed on the structure. As shown in FIG. 5, the layer of second dielectric is then back etched using dry anisotropic etching thereby forming second dielectric spacers 22 on the sidewalls of the first dielectric first pattern 17 and the first dielectric second pattern 19. The second device region of the substrate mentioned previously is that part of the substrate directly below the second dielectric spacers.

Figure 6:
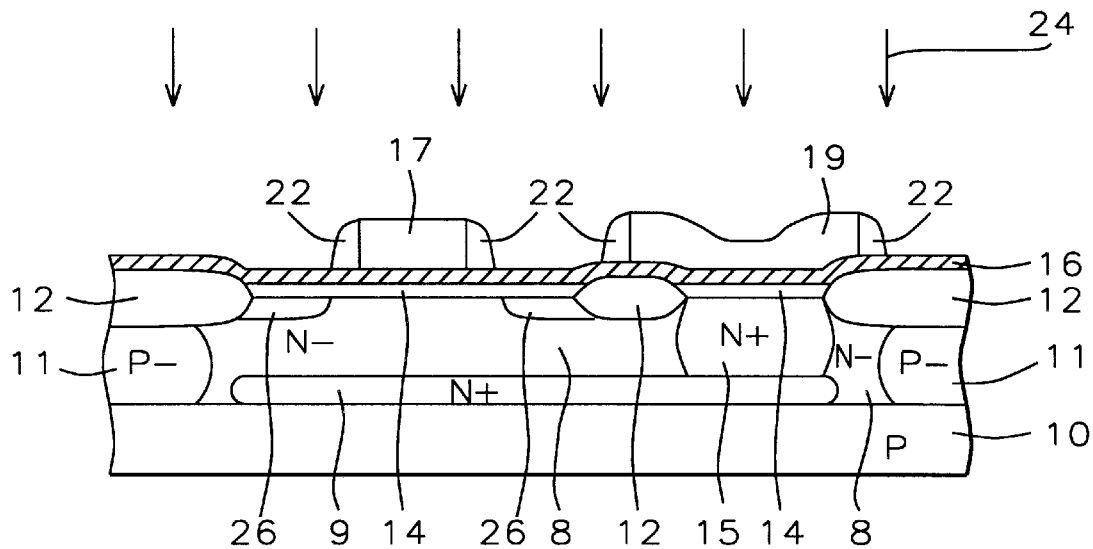
FIG. 6 shows a cross section view of the structure of FIG. 5 showing ion implantation forming the extrinsic base region.

As shown in FIG. 6, the extrinsic base region 26 is then formed using a first ion implantation and the first dielectric first pattern 17, the first dielectric second pattern 19, the spacers 22 on the sidewalls of the first dielectric first pattern 17 and the first dielectric second pattern 19, and the field oxide regions 12 as a mask. In this example of an npn transistor with an N⁻ type epitaxial layer, or N⁻ type well, the first ion implantation uses an ion beam 24 of $B^{11}$ or $BF_2$ ions having a beam density of between about $3 \times 10^{15}$ ions/$cm^2$ and $7 \times 10^{15}$ ions/$cm^2$ and a beam energy of between about 10 KeV and 80 KeV. In the case of a pnp transistor with a P⁻ type epitaxial layer, or P⁻ type well, the first ion implantation uses an ion beam 24 of P or As ions having a beam density of between about $3 \times 10^{15}$ ions/$cm^2$ and $7 \times 10^{15}$ ions/$cm^2$ and a beam energy of between about 10 KeV and 80 KeV. The third device region of the substrate mentioned previously is that part of the substrate occupied by the extrinsic base formed in this manner.

Figure 7:
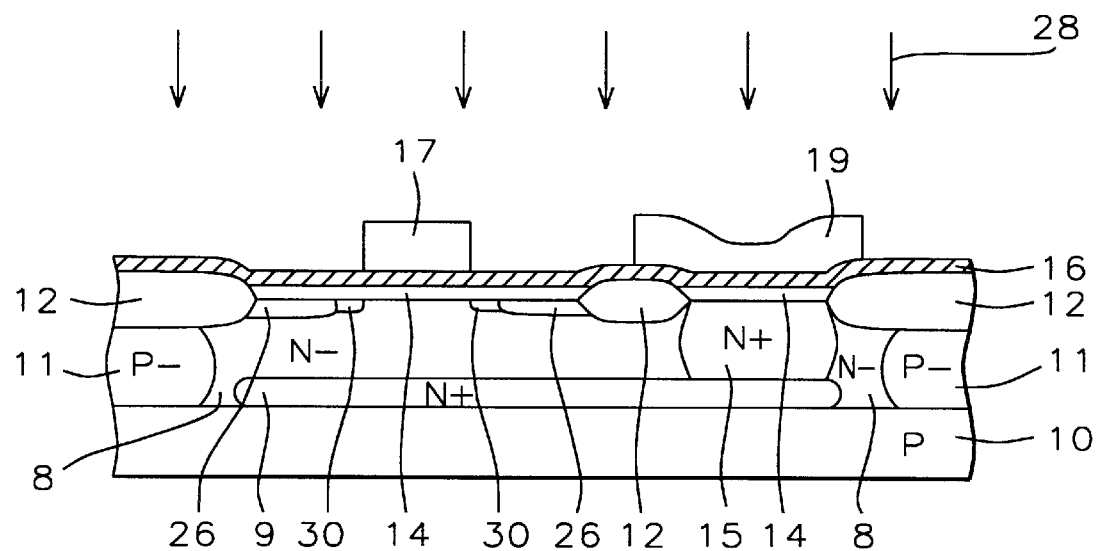
FIG. 7 shows a cross section view of the structure of FIG. 6 after the dielectric spacers have been removed showing ion implantation used to form the base link.

Next, as shown in FIG. 7, the first dielectric spacers are etched away and a base link 30 is formed using a second ion implantation and the first dielectric first pattern 17, the first dielectric second pattern 19, and the field oxide regions 12 as a mask. In this example of an npn transistor with an N⁻ type epitaxial layer, or N⁻ type well, the second ion implantation uses an ion beam 28 of $B^{11}$ or $BF_2$ ions having a beam density of between about $1 \times 10^{13}$ ions/$cm^2$ and $2.5 \times 10^{14}$ ions/$cm^2$ and a beam energy of between about 10 KeV and 80 KeV. In the case of a pnp transistor with a P⁻ type epitaxial layer, or P⁻ type well, the second ion implantation uses an ion beam 28 of P or As ions having a beam density of between about $1 \times 10^{13}$ ions/$cm^2$ and $2.5 \times 10^{14}$ ions/$cm^2$ and a beam energy of between about 10 KeV and 80 KeV.

Figure 8:
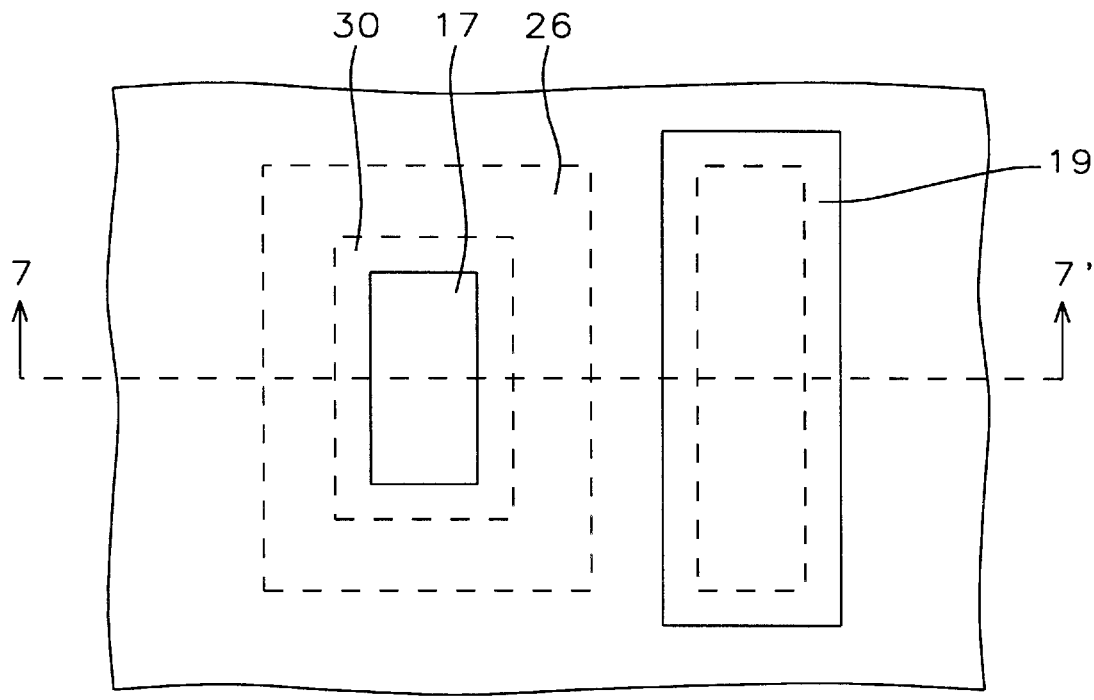
FIG. 8 shows the top view of the structure of FIG. 7.

FIG. 8 shows a top view of this portion of the substrate at this stage of the processing. The dotted lines show the perimeter of the extrinsic base 26 and the base link 30. As shown in FIG. 8, the base link 30 surrounds the first dielectric first pattern 17 and the extrinsic base 26 surrounds the base link 30. The first dielectric second pattern 19 covers the collector contact region. The perimeter of the collector contact region is shown by the dotted line within the first dielectric second pattern 19 which is also the edge of the field oxide isolation region.

Figure 9:
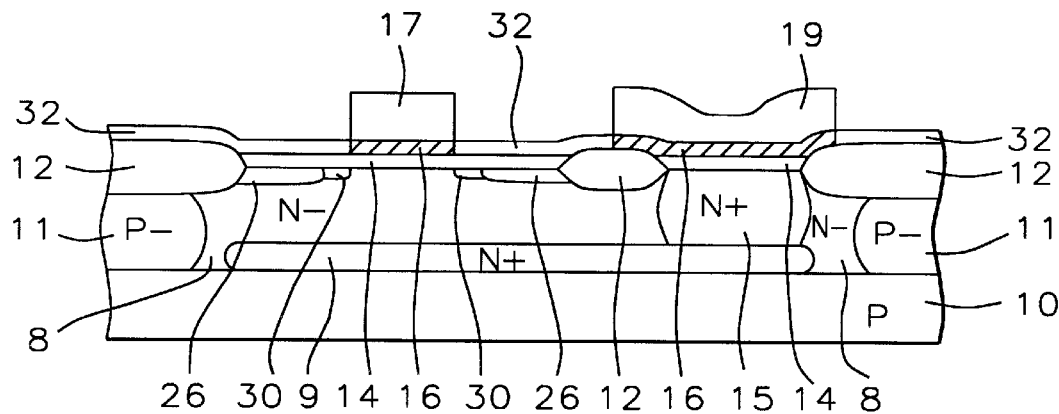
FIG. 9 shows a cross section view of the structure of FIG. 7 after the undoped polysilicon not covered by silicon nitride has been oxidized.
Figure 10:
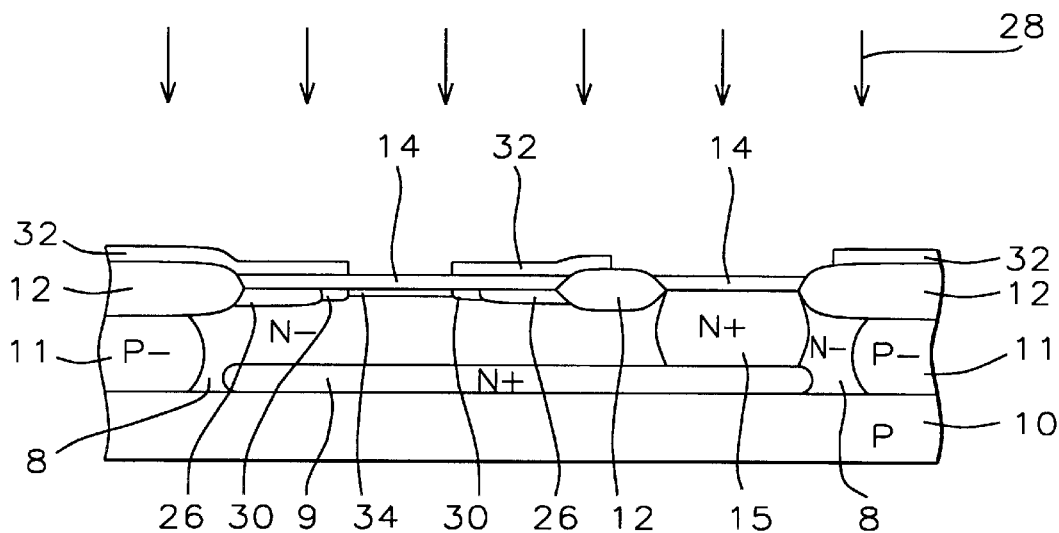
FIG. 10 shows a cross section view of the structure of FIG. 9 after the silicon nitride and unoxidized polysilicon have been removed and ion implantation has been used to form the selective implant collector and the intrinsic base.

Next, as shown in FIG. 9, that part of the layer of first polysilicon which is not covered by the first dielectric first pattern 17 or the first dielectric second pattern 19 is oxidized leaving first polysilicon 16 only directly beneath the first dielectric first pattern 17 and the first dielectric second pattern 19 and converting the remainder of the layer of first polysilicon to silicon oxide 32. That part of the substrate directly below the first dielectric first pattern 17 is the first device region of the substrate. That part of the substrate directly below the first dielectric second pattern 19 and between the field oxide isolation regions 12 is the collector contact region of the substrate. Next, as shown in FIG. 10, The first dielectric first pattern and the first dielectric second pattern are etched away and the remainder of the layer of first polysilicon is etched away.

The intrinsic base 34 is then formed using a third ion implantation and the silicon oxide layer 32 formed from the first polysilicon layer and the field oxide isolation regions 12 as a mask. In this example of an npn transistor with an N⁻ type epitaxial layer, or an N⁻ type well, the third ion implantation uses an ion beam 38 of $BF_2$ or B ions having a beam density of between about $1\times10^{13}$ ions/cm$^2$ and $1\times10^{14}$ ions/cm$^2$ and a beam energy of between about 5 KeV and 80 KeV. In the case of a pnp transistor with a P$^-$ type epitaxial layer, or a P$^-$ type well, the third ion implantation uses an ion beam 28 of P or As ions having a beam density of between about $1\times10^{13}$ ions/cm$^2$ and $1\times10^{14}$ ions/cm$^2$ and a beam energy of between about 5 KeV and 80 KeV.

Figure 11:
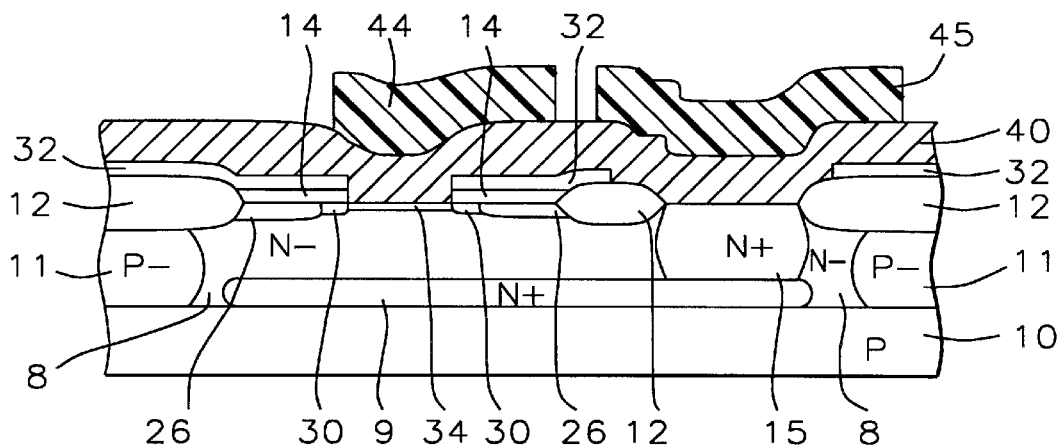
FIG. 11 shows a cross section view of the structure of FIG. 10 after the pad oxide not covered by the oxidized polysilicon has been removed, a layer of doped polysilicon formed, and a photoresist pattern formed.

As shown in FIG. 11, an oxide etch dip is used to remove the pad oxide from the first device region and the collector contact region. A layer of doped second polysilicon 40 is then formed on the substrate. The doped second polysilicon has N$^-$ type doping for the case of the npn transistor with an N$^-$ type epitaxial layer, or an N$^-$ type well, and P$^-$ type doping for the case of the pnp transistor with a P$^-$ type epitaxial layer, or a P$^-$ type well. A layer of photoresist is then formed on the layer of doped second polysilicon and patterned to form an emitter pattern 44 and a collector contact pattern 45.

Figure 12:
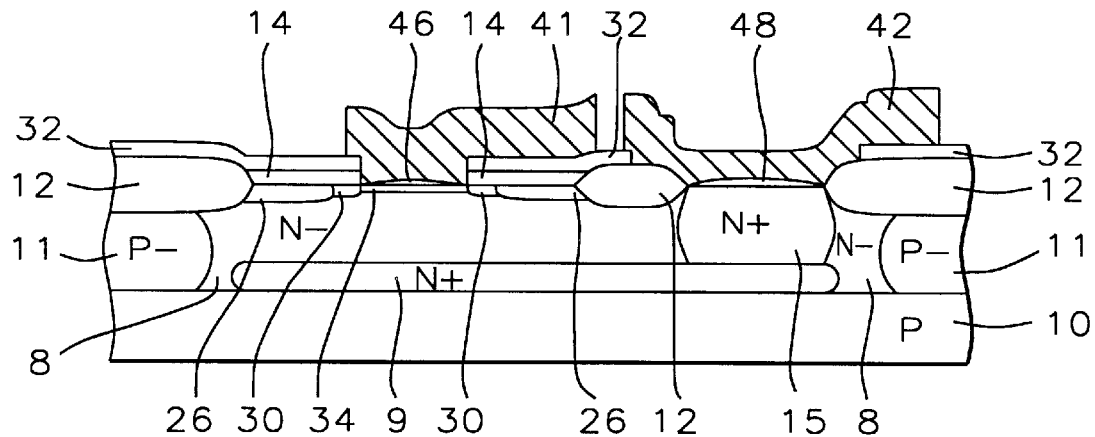
FIG. 12 shows a cross section view of the structure of FIG. 11 after the structure and doped polysilicon have been heated to form the emitter and collector contact.

As shown in FIG. 12, the layer of doped second polysilicon is then patterned using the photoresist emitter pattern and the photoresist collector contact pattern to form an emitter contact electrode 41 and a collector contact electrode 42. The substrate is then heated to between about 900° C. and 1150° C. During the heating step impurities from the doped polysilicon emitter contact electrode pattern 41 diffuse into the first device region forming an emitter 46 and impurities from the doped polysilicon collector contact electrode 42 diffuse into the collector contact region of the substrate forming a collector contact 48. In this example of an npn transistor the impurities in the doped polysilicon emitter contact electrode 41 are N type impurities forming an N type emitter 46 and the impurities in the doped polysilicon collector contact electrode 42 are N type impurities forming a low resistance N type contact to the collector. In a pnp transistor the impurities in the doped polysilicon emitter contact electrode 41 are P type impurities forming a P type emitter 46 and the impurities in the doped polysilicon collector contact electrode 42 are P type impurities forming a low resistance P type contact to the collector.

Figure 13:
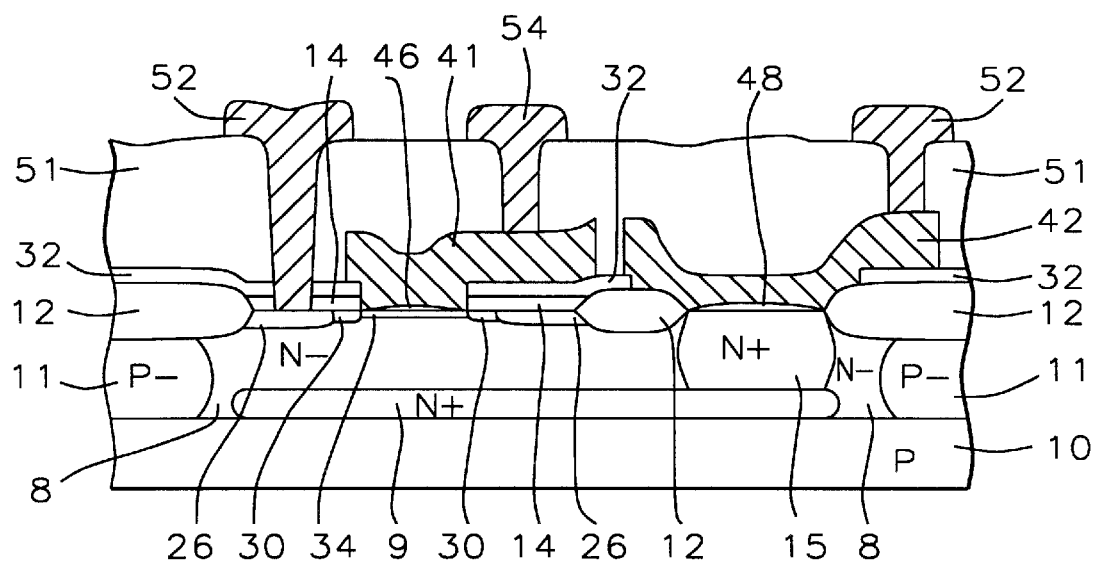
FIG. 13 shows a cross section view of the structure of FIG. 12 after contacts have been formed to the extrinsic base, the polysilicon over the emitter, and the polysilicon over the collector contact.

Next, as shown in FIG. 13, a layer of third dielectric 51, such as silicon oxide, is formed on the substrate. Contact holes are then formed in the layer of third dielectric and a contact 52 to the extrinsic base 26 is formed. A contact 54 to the emitter electrode 41 and a contact 56 to the collector contact electrode 42 are also formed. The base link 30 provides the electrical connection between the extrinsic base 26 and the intrinsic base 34. Since the base link 30 surrounds the intrinsic base 34 and the extrinsic base 26 surrounds the base link 30, see FIG. 8, only one base contact 52 is required. There is a low resistance contact between the emitter electrode and the emitter and between the collector contact electrode and the collector and we obtain a self-aligned bipolar junction transistor. Thus, the base link 30 can be reduced to 0.2 micrometers and the bipolar junction transistor performance can be improved. Silicide contacts are not required or used for contacts to the emitter, collector, or base.

While the invention has been particularly shown and described with reference to the preferred embodiments thereof, it will be understood by those skilled in the art that various changes in form and details may be made without departing from the spirit and scope of the invention.

What is claimed is:

1. A method of forming a bipolar junction transistor, comprising the steps of:

providing a silicon substrate having an N$^-$ type epitaxial layer or N$^-$ well, wherein said N$^-$ type epitaxial layer or N$^-$ well has a first device region, a second device region, a third device region, and a collector contact region;

forming field oxide isolation regions in said N$^-$ type epitaxial layer or N$^-$ well;

forming a layer of pad oxide on said N$^-$ type epitaxial layer or N$^-$ well;

depositing a layer of first polysilicon on said N$^-$ type epitaxial layer or N$^-$ well, wherein said layer of first polysilicon is undoped polysilicon;

depositing a layer of first dielectric on said layer of first polysilicon;

patterning said layer of said first dielectric thereby forming a first dielectric first pattern having sidewalls over said first device region of said N$^-$ type epitaxial layer or N$^-$ well and a first dielectric second pattern having sidewalls over said collector contact region of said N$^-$ type epitaxial layer or N$^-$ well;

forming second dielectric spacers on said sidewalls of said first dielectric first pattern and said sidewalls of said first dielectric second pattern, wherein said second dielectric spacers on said sidewalls of said first dielectric first pattern are over said second device region of said N$^-$ type epitaxial layer or N$^-$ well;

forming an extrinsic base in said third device region of said N$^-$ type epitaxial layer or N$^-$ well using a first ion implantation and said first dielectric first pattern, said second dielectric spacers on said sidewalls of said first dielectric first pattern, and said first dielectric second pattern as a mask, wherein said extrinsic base region is P type silicon;

etching away said second dielectric spacers from said first dielectric first pattern and said first dielectric second pattern;

forming a base link in said second device region of said N$^-$ type epitaxial layer or N$^-$ well using a second ion implantation and said first dielectric first pattern and said first dielectric second pattern as a mask, wherein said base link is P type silicon;

oxidizing that part of said layer of first polysilicon not covered by said first dielectric first pattern and said first dielectric second pattern;

etching away said first dielectric first pattern, said first dielectric second pattern, and that part of said layer of polysilicon which has not been oxidized;

forming an intrinsic base in said first device region of said N$^-$ type epitaxial layer or N$^-$ well using a third ion implantation and the oxidized part of said polysilicon layer as a mask, wherein said intrinsic base is P type silicon;

removing said pad oxide from said first device region and said collector contact region using an oxide etch dip;

forming a layer of second polysilicon wherein said second polysilicon is doped with N type impurities;

patterning said layer of second polysilicon thereby forming a second polysilicon emitter contact pattern covering said first device region of said N$^-$ type epitaxial layer or N$^-$ well and a second polysilicon collector contact pattern covering said collector contact region of said N$^-$ type epitaxial layer or N$^-$ well;

heating said N$^-$ type epitaxial layer or N$^-$ well thereby diffusing said N type impurities from said second polysilicon emitter contact pattern into said first device region of said N$^-$ type epitaxial layer or N$^-$ well forming an emitter, and from said second polysilicon collector contact pattern into said collector contact region of said N⁻ type epitaxial layer or N⁻ well forming a collector contact; and forming a base contact to said extrinsic base.

2. The method of claim 1 wherein said layer of pad oxide is silicon oxide having a thickness of between about 50 and 240 Angstroms.

3. The method of claim 1 wherein said layer of first polysilicon has a thickness of between about 100 and 250 Angstroms.

4. The method of claim 1 wherein said first dielectric is silicon nitride having a thickness of between about 1600 and 2400 Angstroms.

5. The method of claim 1 wherein said second dielectric spacers are silicon oxide spacers.

6. The method of claim 1 wherein said first ion implantation comprises $B^{11}$ or $BF_2$ ions having a beam density of between about $3 \times 10^{15}$ ions/cm² and $7 \times 10^{15}$ ions/cm² and a beam energy of between about 10 KeV and 80 KeV.

7. The method of claim 1 wherein said second ion implantation comprises $B^{11}$ or $BF_2$ ions having a beam density of between about $1 \times 10^{13}$ ions/cm² and $2.5 \times 10^{14}$ ions/cm² and a beam energy of between about 10 KeV and 80 KeV.

8. The method of claim 1 wherein said third ion implantation comprises $BF_2$ or $B^{11}$ ions having a beam density of between about $1 \times 10^{13}$ ions/cm² and $1 \times 10^{14}$ ions/cm² and a beam energy of between about 5 KeV and 80 KeV.

9. A method of forming a bipolar junction transistor, comprising the steps of:

providing a silicon substrate having a P⁻ type epitaxial layer or a P⁻ type well, wherein said P⁻ type epitaxial layer or P⁻ type well has a first device region, a second device region, a third device region, and a collector contact region;

forming field oxide isolation regions in said P⁻ type epitaxial layer or P⁻ type well;

forming a layer of pad oxide on said P⁻ type epitaxial layer or P⁻ type well;

depositing a layer of first polysilicon on said P⁻ type epitaxial layer or P⁻ type well, wherein said layer of first polysilicon is undoped polysilicon;

depositing a layer of first dielectric on said layer of first polysilicon;

patterning said layer of said first dielectric thereby forming a first dielectric first pattern having sidewalls over said first device region of said P⁻ type epitaxial layer or P⁻ type well and a first dielectric second pattern having sidewalls over said collector contact region of said P⁻ type epitaxial layer or P⁻ type well;

forming second dielectric spacers on said sidewalls of said first dielectric first pattern and said sidewalls of said first dielectric second pattern, wherein said second dielectric spacers on said sidewalls of said first dielectric first pattern are over said second device region of said P⁻ type epitaxial layer or P⁻ type well;

forming an extrinsic base in said third device region of said P⁻ type epitaxial layer or P⁻ type well using a first ion implantation and said first dielectric first pattern, said second dielectric spacers on said sidewalls of said first dielectric first pattern, and said first dielectric second pattern as a mask, wherein said extrinsic base region is N type silicon;

etching away said second dielectric spacers from said first dielectric first pattern and said first dielectric second pattern;

forming a base link in said second device region of said P⁻ type epitaxial layer or P⁻ type well using a second ion implantation and said first dielectric first pattern and said first dielectric second pattern as a mask, wherein said base link is N type silicon;

oxidizing that part of said layer of first polysilicon not covered by said first dielectric first pattern and said first dielectric second pattern;

etching away said first dielectric first pattern, said first dielectric second pattern, and that part of said layer of polysilicon which has not been oxidized;

forming an intrinsic base in said first device region of said P⁻ type epitaxial layer or P⁻ type well using a third ion implantation and the oxidized part of said polysilicon layer as a mask, wherein said intrinsic base is N type silicon;

removing said pad oxide from said first device region and said collector contact region using an oxide etch dip;

forming a layer of second polysilicon wherein said second polysilicon is doped with P type impurities;

patterning said layer of second polysilicon thereby forming a second polysilicon emitter contact pattern covering said first device region of said P⁻ type epitaxial layer or P⁻ type well and a second polysilicon collector contact pattern covering said collector contact region of said P⁻ type epitaxial layer or P⁻ type well;

heating said P⁻ type epitaxial layer or P⁻ type well thereby diffusing said P type impurities from said second polysilicon emitter contact pattern into said first device region of said P⁻ type epitaxial layer or P⁻ type well forming an emitter, and from said second polysilicon collector contact pattern into said collector contact region of said P⁻ type epitaxial layer or P⁻ type well forming a collector contact; and forming a base contact to said extrinsic base.

10. The method of claim 9 wherein said layer of pad oxide is silicon oxide having a thickness of between about 50 and 240 Angstroms.

11. The method of claim 9 wherein said layer of first polysilicon has a thickness of between about 100 and 250 Angstroms.

12. The method of claim 9 wherein said first dielectric is silicon nitride having a thickness of between about 1600 and 2400 Angstroms.

13. The method of claim 9 wherein said second dielectric spacers are silicon oxide spacers.

14. The method of claim 9 wherein said first ion implantation comprises P or As ions having a beam density of between about $3 \times 10^{15}$ ions/cm² and $7 \times 10^{15}$ ions/cm² and a beam energy of between about 10 KeV and 80 KeV.

15. The method of claim 9 wherein said second ion implantation comprises P or As ions having a beam density of between about $1 \times 10^{13}$ ions/cm² and $2.5 \times 10^{14}$ ions/cm² and a beam energy of between about 10 KeV and 80 KeV.

16. The method of claim 9 wherein said third ion implantation comprises P or As ions having a beam density of between about $1 \times 10^{13}$ ions/cm² and $1 \times 10^{14}$ ions/cm² and a beam energy of between about 5 KeV and 80 KeV.

* * * * *